(12) United States Patent
Pan et al.

(10) Patent No.: US 10,298,184 B2
(45) Date of Patent: May 21, 2019

(54) DUAL DEVICE SEMICONDUCTOR STRUCTURES WITH SHARED DRAIN

(71) Applicant: Cirrus Logic International Semiconductor Ltd., Edinburgh (GB)

(72) Inventors: Shanjen Pan, Austin, TX (US); Marc L. Tarabbia, Austin, TX (US); Christian Larsen, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 20 days.

(21) Appl. No.: 15/072,097

(22) Filed: Mar. 16, 2016

(65) Prior Publication Data

US 2017/0272042 A1 Sep. 21, 2017

(51) Int. Cl.

| | |
|---|---|
| H03F 3/217 | (2006.01) |
| H01L 27/02 | (2006.01) |
| H01L 21/8234 | (2006.01) |
| H01L 29/08 | (2006.01) |
| H03F 3/185 | (2006.01) |
| H01L 27/088 | (2006.01) |
| H03F 3/187 | (2006.01) |
| H03F 3/45 | (2006.01) |
| H01L 49/02 | (2006.01) |

(Continued)

(52) U.S. Cl.
CPC ..... *H03F 3/185* (2013.01); *H01L 21/823425* (2013.01); *H01L 21/823475* (2013.01); *H01L 21/823481* (2013.01); *H01L 27/088* (2013.01); *H01L 28/00* (2013.01); *H01L 29/0696* (2013.01); *H01L 29/0847* (2013.01); *H01L 29/66659* (2013.01); *H03F 3/187* (2013.01); *H03F 3/2171* (2013.01); *H03F 3/2178* (2013.01); *H03F 3/45475* (2013.01); *H01L 21/823418* (2013.01); *H01L 27/0207* (2013.01); *H03F 2200/03* (2013.01); *H03F 2200/366* (2013.01)

(58) Field of Classification Search
None
See application file for complete search history.

(56) References Cited

U.S. PATENT DOCUMENTS

| | | | |
|---|---|---|---|
| 6,472,709 B1 | 10/2002 | Blanchard | |
| 8,536,648 B2 * | 9/2013 | Shrivastava | ........ H01L 29/0642 257/335 |
| 2009/0179270 A1 | 7/2009 | Chen et al. | |

(Continued)

FOREIGN PATENT DOCUMENTS

| | | |
|---|---|---|
| CN | 105226097 A | 1/2016 |
| JP | H04258173 A | 9/1992 |

*Primary Examiner* — Robert K Carpenter
(74) *Attorney, Agent, or Firm* — Norton Rose Fulbright US LLP

(57) ABSTRACT

Transistors may be manufactured with a shared drain to reduce die area consumed by circuitry. In one example, two transistors can be manufactured that include two body regions that abut a shared drain region. The two transistors can be independently operated by coupling terminals to a source and a gate for each transistor and the shared drain. Characteristics of the two transistors can be controlled by adjusting feature sizes, such as overlap between the gate and the shared drain for a transistor. In particular, two transistors with different voltage requirements can be manufactured using a shared drain structure, which can be useful in amplifier circuitry and in particular Class-D amplifiers.

11 Claims, 6 Drawing Sheets

(51) Int. Cl.
*H01L 29/66* (2006.01)
*H01L 29/06* (2006.01)

(56) References Cited

U.S. PATENT DOCUMENTS

| | | |
|---|---|---|
| 2010/0032757 A1 | 2/2010 | Pendharkar |
| 2011/0291170 A1* | 12/2011 | Chumakov ......... H01L 23/5223 257/300 |
| 2014/0103962 A1 | 4/2014 | Ajram |
| 2014/0285178 A1 | 9/2014 | Williams |
| 2015/0270333 A1 | 9/2015 | Yang et al. |

* cited by examiner

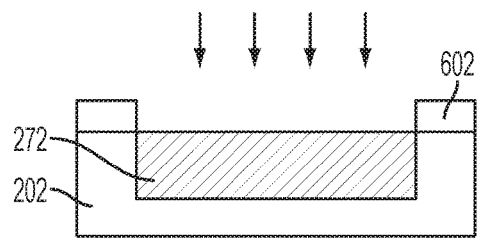
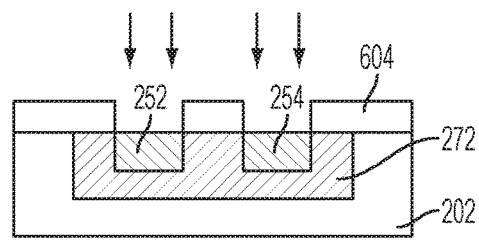
FIG. 6A FIG. 6B
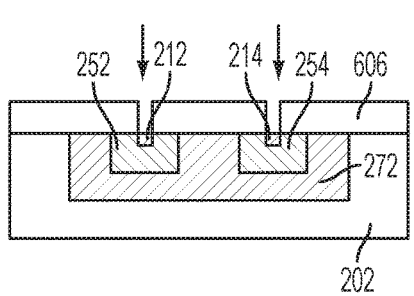
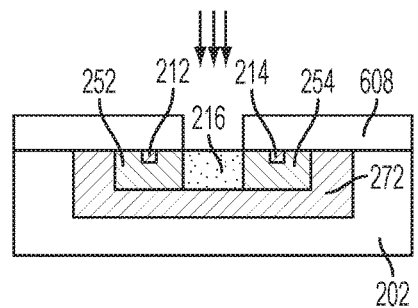
FIG. 6C FIG. 6D
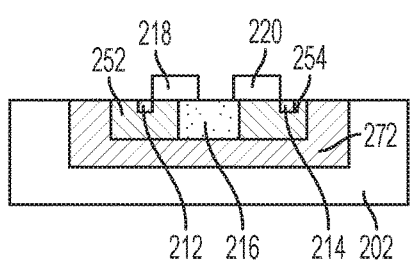
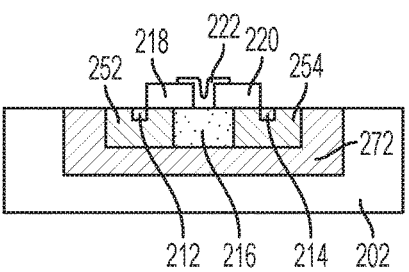
FIG. 6E FIG. 6F

DUAL DEVICE SEMICONDUCTOR STRUCTURES WITH SHARED DRAIN

FIELD OF THE DISCLOSURE

The instant disclosure relates to semiconductor devices. More specifically, portions of this disclosure relate to transistor structures and methods of manufacturing the transistor structures.

BACKGROUND

Electronic devices have proliferated in recent decades as a result of the phenomenal increase in capability and simultaneous reduction in their costs. These electronic devices generally all include transistors that are arranged and connected together in particular configurations to perform certain functions. In one example, transistors can be coupled together to perform amplifier functions to amplify audio signals for output to headphones. In another example, transistors can also be coupled together to perform logic functions, such as addition and multiplication, in microprocessors. In a further example, transistors can further be coupled together to store data, such as in memory and solid state storage (SSD) devices. It is no surprise, thus, that individual electronic components inside electronic devices can include tens, hundreds, thousands, or even millions of transistors to accomplish all of the functionality incorporated in the electronic devices.

One common configuration for transistors within various electronic components is to couple the drains of two transistors together. Transistors generally include at least three terminals for connections: a source, a drain, and a gate. A signal applied to the gate terminal can change a resistance between the source and drain terminals and cause current to flow through the transistor. Amplifier circuitry may include one or more pairs of transistors with the drain terminals connected together. One example of a semiconductor structure for two transistors with coupled drain terminals is shown in FIG. 1. FIG. 1 is an example cross-section illustrating two transistors coupled at their respective drain terminals. Two independent transistors 110 and 120 are manufactured in a substrate 102. The transistors 110 and 120 may include an n-well 112, in which resides a source 114 and a drain 116, and a gate terminal 118. The gate terminals 118 may be coupled together by wiring in other layers built above the transistors 110 and 120. The semiconductor structure of FIG. 1 illustrates the results of a conventional manufacturing process that takes a common template for a transistor and manufactures the templated transistor many times to form an electronic component. That is, if two transistors are needed in a circuit, then two transistors are manufactured and coupled together, such as through coupling 130, to perform the desired function.

The structure of FIG. 1 may be simple to manufacture by simply manufacturing two conventional structures in a substrate and connecting them in a particular manner. However, this structure consumes a large amount of space on the substrate. There are continuing demands on electronic components to be smaller, and also cheaper. This large structure, which is duplicated many, even hundreds of times, in an electronic device, may inhibit further reduction in sizes and cost of the devices.

Shortcomings mentioned here are only representative and are included simply to highlight that a need exists for improved electrical components, particularly for transistors employed in consumer-level devices, such as mobile phones. Embodiments described herein address certain shortcomings but not necessarily each and every one described here or known in the art.

SUMMARY

A semiconductor structure can be manufactured to perform the function of two or more individual transistors with reduced size by sharing one or more components between the two or more transistors. In one embodiment, a shared drain terminal may be used between the two or more transistors, instead of individual drains for each transistor. This semiconductor structure may have a reduced size compared to the conventional structures, such as those described above, for accomplishing the same functionality. For example, by reducing some duplicative structures, at least one lateral dimension, such as the length of the structure, may be proportionally reduced. In one embodiment, the duplicative structure being removed is the two separate drain structures of FIG. 1, such that the semiconductor structure includes one physical drain shared by two or more transistors. An additional advantage of the semiconductor structure with a shared drain is the ability to vary parameters, such as dimensions, of structures on either side of the shared drain to configure the two functional transistors with different capabilities. For example, one transistor-equivalent structure using the shared drain may be manufactured to operate at a first supply voltage and another transistor-equivalent structure using the shared drain may be manufactured to operate at a second higher supply voltage. Further, although only two transistor-equivalent structures are described coupled to the shared drain, multiple transistor-equivalent structures may share a drain.

According to one embodiment, a field effect transistor (FET) structure may include a first source and a second source; a first body and a second body; a first gate and a second gate; and/or a drain shared by the first source, the second source, the first body, the second body, the first gate, and the second gate, wherein the drain is coupled to a buried layer such that the first source and the first body are isolated from the second source and the second body.

In certain embodiments, the first source, the first body, the second source, and the second body are isolated by the buried layer from a substrate; the first source, the first body, the first gate, and the shared drain operate as a first transistor, and wherein the second source, the second body, the second gate, and the shared drain operate as a second transistor; the shared drain may be configured to float during operation of the first transistor and the second transistor; the first transistor may be configured to operate at a first voltage requirement; the second transistor may be configured to operate at a second different voltage requirement; a first overlap distance between the shared drain and the first may be different than a different second overlap distance between the shared drain and the second gate; and/or the shared drain may provide an equivalent structure of two separate drains of two separate transistors that are coupled together.

In certain embodiments, the field effect transistor (FET) structure may also include a third source; a third body; and/or a third gate, wherein the drain is also shared by the third source and the third gate.

According to another embodiment, a method for manufacturing a field effect transistor (FET) structure may include forming a first source and a second source; forming a first body and a second body; forming a first gate and a second gate; and/or forming a drain shared by the first source, the first body, the second source, the second body, the first gate, and the second gate, wherein the drain is coupled to a buried layer such that the first source and the first body are isolated from the second source and the second body.

In certain embodiments, the first source and the second source may be isolated by the buried layer from a substrate; the first source, the first body, the first gate, and the shared drain may operate as a first transistor; the second source, the second body, the second gate, and the shared drain may operate as a second transistor; the first transistor may be configured to operate at a first voltage requirement and the second transistor is configured to operate at a second voltage requirement; and/or an overlap distance between the shared drain and the first gate may be different than an overlap distance between the shared drain and the second gate.

According to another embodiment, an apparatus may include a controller integrated circuit (IC) having a first audio input configured to receive an audio signal; and/or an amplifier coupled to the first audio input and comprising one or more field effect transistors (FETs). At least one of the one or more FETs may include a first source and a second source; a first body and a second body; a first gate and a second gate; and/or a drain shared by the first source, the first body, the second source, the second body, the first gate, and the second gate. The drain may be coupled to a buried layer such that the first source and the first body and the second source and the second body are isolated from each other.

In certain embodiments, the first source and the first body and the second source and the second body may be isolated by the buried layer from a substrate; the first source, the first body, the first gate, and the shared drain may operate as a first transistor; the second source, the second body, the second gate, and the shared drain may operate as a second transistor; the shared drain may be configured to float during operation of the first transistor and the second transistor; the first transistor may be configured to operate at a first voltage requirement; the second transistor may be configured to operate at a second voltage requirement; an overlap distance between the shared drain and the first gate may be different than an overlap distance between the shared drain and the second gate; and/or the shared drain may provide an equivalent structure of two separate drains of two separate transistors that are coupled together The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

FIGS. 6A-6F are cross-sections showing various stages of a semiconductor structure with a shared drain at different steps during semiconductor manufacturing according to one embodiment of the disclosure.

DETAILED DESCRIPTION

Figure 1:
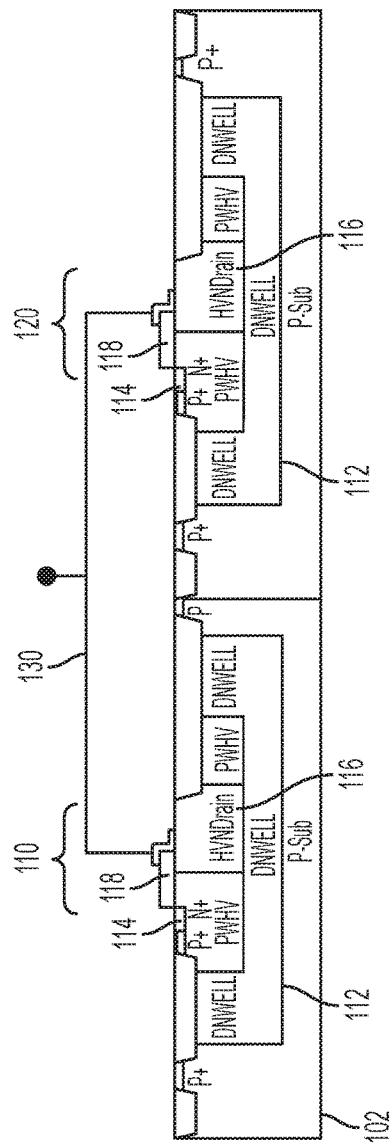
FIG. 1 is an example cross-section illustrating two transistors coupled at their respective drain terminals.
Figure 2:
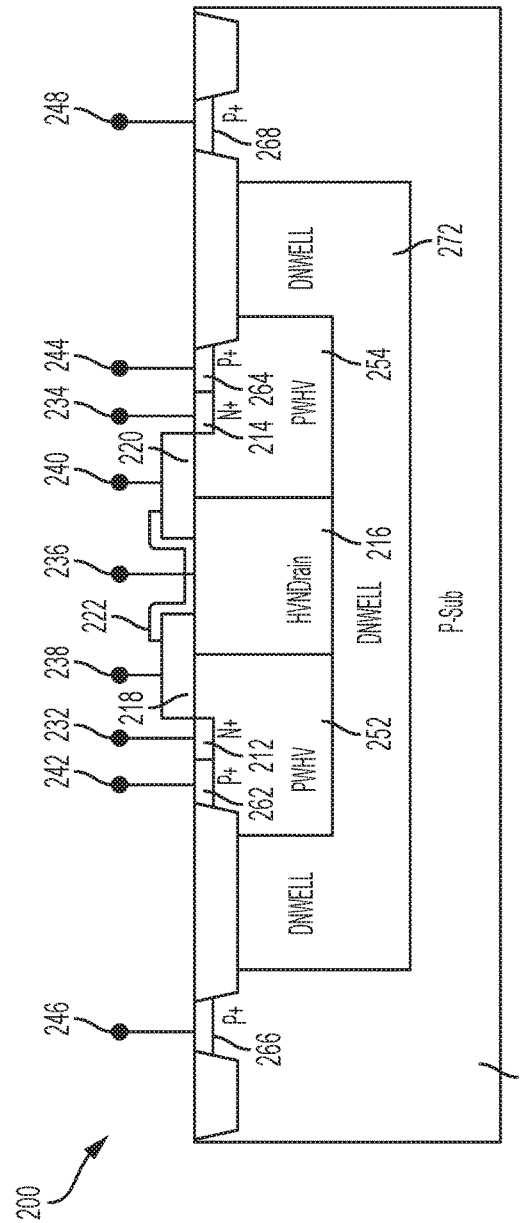
FIG. 2 is an example cross-section illustrating a semiconductor structure with a shared drain according to one embodiment of the disclosure.

FIG. 2 is an example cross-section illustrating a semiconductor structure with a shared drain according to one embodiment of the disclosure. A semiconductor structure 200 may be formed in a substrate 202 that is doped with a carrier of a first type, such as a p-type dopant. The substrate 202 may alternatively be doped with n-type carriers or undoped. Further, the substrate 202 may include semiconductor materials, including alloy semiconductors, such as Silicon, Silicon Germanium (SiGe), Gallium Arsenide (GaAs), and others. In the substrate 202, two sources 212 and 214 may be located around a shared drain 216. The sources 212 and 214 and drain 216 may be doped regions formed in the substrate 202, such as by implantation processes. In one embodiment, the sources 212 and 214 may be n-doped, and the drain 216 may be n-doped. However, the doping types may also be switched such that the drain 216 is p-doped, and the sources 212 and 214 are p-doped. A first transistor body 252 and a second transistor body 254 may be formed around the drain 216. The bodies 252 and 254 may be doped with an opposite polarity dopant from the drain 216. For example, when the drain 216 is p-type doped, the bodies 252 and 254 may be n-type doped, and when the drain 216 is n-type doped, the bodies 252 and 254 may be p-type doped. The bodies 252 and 254 form the channels for the two transistors in the semiconductor structure 200.

A first gate 218 may be situated above and span the source 212 and the drain 216. A second gate 220 may be situated above and span the source 214 and the drain 216. The gates 218 and 220 may be conducting materials, and a thin insulating layer (not shown) may separate the gates 218 and 220 from the sources 212 and 214 and the drain 216. A Silicide block layer 222 may couple the gates 218 and 220 with the drain 216. Although a Silicide block layer 222 is shown, other conductive or semiconductor materials may be used to couple the drain 216 to other elements.

The sources 212 and 214 and the drain 216 may form a two transistor-equivalent structure, such as an equivalent of two field effect transistors (FETs). The n-p-n junction between the source 212, the body 252, and the drain 216 may form a portion of a first transistor. The n-p-n junction between the source 214, the body 254, and the drain 216 may form a portion of a second transistor. Electrical terminals may be coupled to portions of the semiconductor structure 200 to provide control of the two transistor structures sharing the drain 216. For example, a first source terminal 232 may couple to the source 212, a second source terminal 234 may couple to the source 214, a drain terminal 236 may couple to the drain 216, a first gate terminal 238 may couple to the gate 218, a second gate terminal 240 may couple to the gate 220, a first body terminal 242 may couple to the body 252, and a second body terminal 244 may couple to the body 254. Additional local doping may be used to improve connection with certain terminals. For example, enhanced doped regions 262 and 264 may be placed in the bodies 252 and 254, respectively. The enhanced doped regions 262 and 264 may be p+-doped when the bodies 252 and 254 are p-doped, or alternatively be n+-doped when the bodies 252 and 254 are n-doped. Additional terminals may be added to the semiconductor structure 200, such as substrate terminals 246 and 248. These terminals may also be coupled to enhanced doped regions 266 and 268, respectively, which may be of a same polarity dopant as the substrate 202 but have a higher concentration of dopants.

The two transistors formed with the shared drain 216 may be isolated from the substrate. For example, a deep well 272, or buried layer, may be formed in the substrate 202 and the bodies 252 and 254, the sources 212 and 214, and the drain 216 may be formed in the deep well 272. Thus, the drain 216 may be coupled to a buried layer such that the first source and the first body are isolated from the second source and the second body. The deep well 272 may have a dopant of an opposite polarity of the substrate 202. For example, when the substrate 202 is p-type doped, the deep well 272 may be n-type doped. Further, the shared drain 216 may float, meaning to rest at an indeterminate voltage level, during operation of the first transistor and the second transistor The semiconductor structure 200 provides an equivalent of two transistors in a reduced amount of space compared to a conventional semiconductor structure with two individual transistors. By reducing some overlap in components between the two transistors, the equivalent semiconductor structure reduces the space consumed by the two transistors by the amount of overlap. For example, whereas conventional semiconductor structures would include two drains for two transistors, the semiconductor structure 200 includes a signal shared drain 216 between two transistors. As another example, whereas conventional semiconductor structures would include two drain terminals and associated wiring, the semiconductor structure 200 may include a single drain terminal 236.

Figure 3:
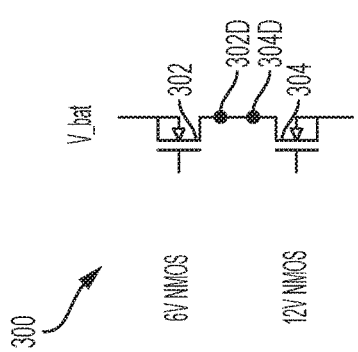
FIG. 3 is a circuit schematic illustrating two transistor-equivalent structures with coupled drain terminals.

The two transistors with coupled drains of the semiconductor structure 200 may be used in electronic circuits, and one such electronic circuit is shown in FIG. 3. FIG. 3 is a circuit schematic illustrating two transistor-equivalent structures with coupled drain terminals. A circuit 300 may include a first transistor 302 and a second transistor 304. A drain terminal 302D of the first transistor 302 may be coupled to a drain terminal 304D of the second transistor 304. Because the drain terminals 302D and 304D are coupled, the circuit 300 may be manufactured in an electronic device using the semiconductor structure 200 of FIG. 2. For example, the drain terminals 302D and 304D may both represent the drain terminal 236, the transistor 302 may be the n-p-n structure of drain 216, body 252, and source 212, and the transistor 304 may be the n-p-n structure of drain 216, body 254, and source 214. The circuit 300 may be manufactured on a semiconductor substrate in a configuration similar to that of FIG. 2 such that the area of the substrate occupied by the circuit 300 is reduced compared to the conventional technique of replicating each transistor in full. Because circuit 300 is a common circuit building block that may be used many times in an electronic device, such as a cellular phone or personal media device, the substrate area consumed in circuitry for such a device may be significantly reduced by using the semiconductor structure of FIG. 2.

In some uses of the circuit 300 in an electronic device, there may be a need or desire for the transistors 302 and 304 to have different characteristics. For example, a portion of an electronic device implementing the circuit 300 may implement the transistors 302 and 304 operating with different voltage requirements. As such, the transistor 302 may be a 6 Volt n-type metal-oxide-semiconductor (NMOS) transistor and the transistor 304 may be a 12 Volt NMOS transistor. Different characteristics for the transistors 302 and 304 may be obtained by varying certain characteristics of the semiconductor structure 200 of FIG. 2. For example, although the semiconductor structure 200 is shown as a symmetrical structure around an imaginary line drawn through a middle point of the drain 216, the semiconductor structure 200 need not be symmetrical around that axis or any other axis.

Figure 4:
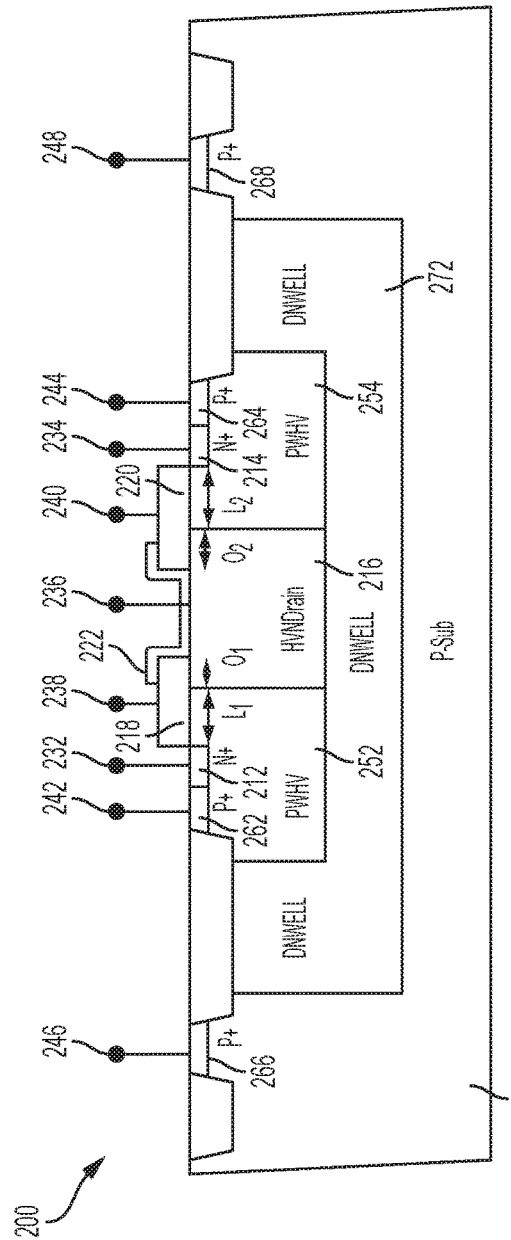
FIG. 4 is an example cross-section illustrating a semiconductor structure with a shared drain according to another embodiment of the disclosure.

Different characteristics for the transistors 302 and 304 may be obtained by varying features of the semiconductor structure 302 and the shared drain 216. One example of such semiconductor structure is shown in FIG. 4, where the two transistor structures are asymmetrical around the shared drain to form two transistors with different voltage requirements. FIG. 4 is an example cross-section illustrating a semiconductor structure with a shared drain according to another embodiment of the disclosure. A distance O1 between an edge of the gate 218 over the drain 216 and a boundary between the drain 216 and the body 252 may be different from a distance O2 between an edge of the gate 220 over the drain 216 and a boundary between the drain 216 and the body 254. For example, a distance O1 may be approximately 0.2 micrometers such that one transistor has a 6 Volt operational requirement, and a distance O2 may be approximately 0.6-0.8 micrometers such that another transistor has an 8 Volt operational requirement. In other configurations, the two transistors may be configured to have 6 Volt and 12 Volt operational requirements. Although O1 and O2 distances are described with respect to FIG. 4, other features of the semiconductor structure may be varied between the transistors making up the semiconductor structure to change features and requirements of the two transistors. For example, a distance L1 between an edge of the drain 216 and the source 212 may be different from a distance L2 between an edge of the drain 216 and the source 214 to change characteristics of the two transistors.

Figure 5:
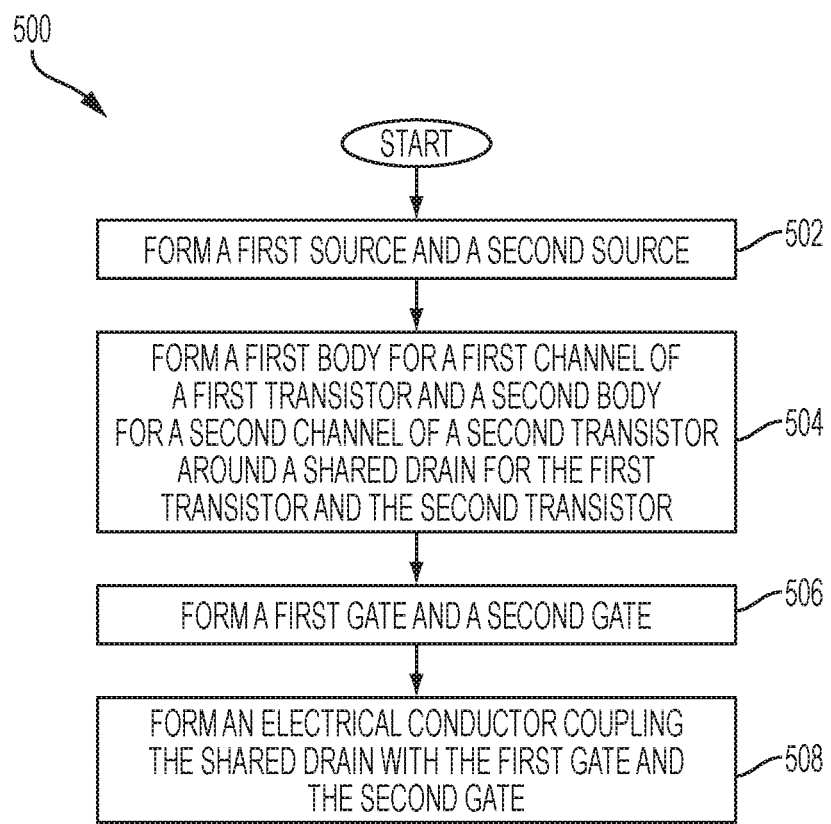
FIG. 5 is a flow chart illustrating a method of manufacturing a semiconductor structure with a shared drain according to one embodiment of the disclosure.

The semiconductor structures with a shared drain may be manufactured according to many manufacturing techniques and methods. One example manufacturing method is illustrated in FIG. 5. FIG. 5 is a flow chart illustrating a method of manufacturing a semiconductor structure with a shared drain according to one embodiment of the disclosure. A method 500 may include, at block 502, forming a first source and a second source in a substrate. At block 504, the method 500 may include forming additional structures, including a first body for a first channel of a first transistor and a second body for a second channel of a second transistor around a shared drain for the first transistor and the second transistor. Blocks 502 and 504 may both include ion implantation into a substrate to deposit dopants at a specific concentration in a specific area of the substrate corresponding to the body, source, and drain. Further, a first gate and a second gate may be formed at block 506. The gates may be formed, for example, through deposition and/or patterning of conductive materials. For example, a metal, such as Aluminum or Copper, may be deposited on the substrate and patterned to form the gate electrodes. In another example, other conductive materials such as graphene may be formed on certain regions of the substrate corresponding to the formed source, body, and drains. Although blocks 502, 504, and 506 are shown in a sequence, the formation of various elements of a semiconductor structure can proceed in many different orders and sequences. For example, the first and second body at block 504 may be formed before a source and a drain are formed at block 502. After the semiconductor structure is largely compete, electrical contacts and other features may be formed to connect to the formed transistor structures. In particular, an electrical conductor may be formed at block 508 to electrically couple the shared drain with the first gate and the second gate formed earlier at block 506.

Another manufacturing method for semiconductor structures having a shared drain is illustrated through the illustrations of FIGS. 6A-6F. FIGS. 6A-6F are cross-sections showing various stages of a semiconductor structure with a shared drain at different steps during semiconductor manufacturing according to one embodiment of the disclosure. In FIG. 6A, a masking layer 602 is deposited and patterned on the substrate 202. An opening in the masking layer 602 is formed to allow ions to be implanted in region 272 of the substrate 202. The region 272 may be, for example, a deep n-well. Next, in FIG. 6B, a masking layer 604 is deposited and patterned on the substrate 202. An opening in the masking layer 604 is formed to allow ions to be implanted in regions 252 and 254, corresponding to a first and second body of a transistor. Then, in FIG. 6C, a masking layer 606 is deposited and patterned on the substrate 202 over the regions 252, 254, and 272. An opening in the masking layer 606 is formed to allow ions to be implanted in regions 212 and 214, corresponding to two sources for two transistor structures. The masking layer 606 may be removed from the substrate 202 and a new masking layer 608 shown in FIG. 6D deposited and patterned with openings for forming a shared drain between the two sources 212 and 214. Ion implantation through the masking layer 608 may be used to modify characteristics of region 216 in the substrate 202. In some embodiments, the further modification of region 216 may be omitted, such as when the ion implant of region 272 results in suitable characteristics for the shared drain 216. Next, gates 218 and 220 may be deposited as shown in FIG. 6E. Although not shown, an insulating layer may be deposited on the substrate 202 prior to deposition and patterning of the gates 218 and 220, such that the gates 218 and 220 are not in direct contact with the bodies 252 and 254 and shared drain 216. Next, a Silicide block layer 222 shown in FIG. 6F may be deposited and patterned to couple the shared drain 216 to the gates 218 and 220. The resulting semiconductor structure in FIG. 6F may be used as two transistors by coupling terminals to the source 212, the gate 218, and the Silicide block layer 222 for a first transistor and by coupling terminals to the source 214, the gate 220, and the Silicide block layer 222 for a second transistor.

Figure 7:
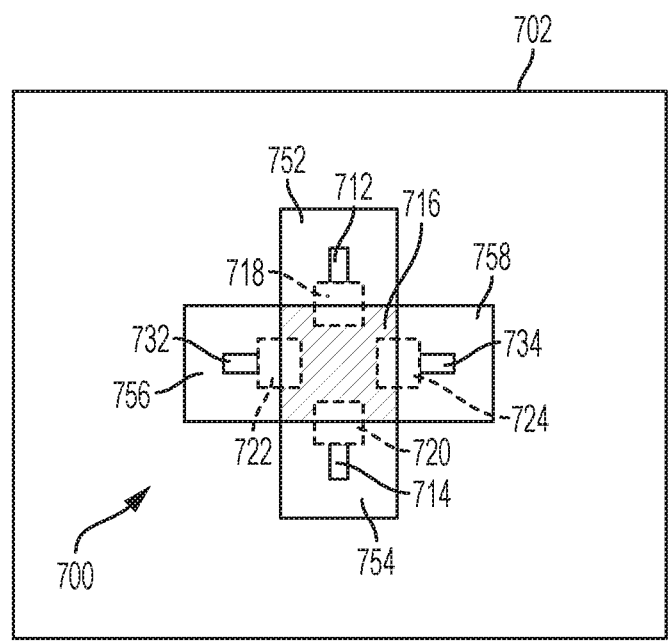
FIG. 7 is a top-down view of a semiconductor structure with multiple transistor-equivalent structures having a shared drain according to one embodiment of the disclosure.

Although a semiconductor structure and manufacturing methods for forming two transistors with a shared drain are described, more than two transistors may share the shared drain. For example, by arranging transistors in three dimensions around the shared drain, four transistors may share a drain as shown in FIG. 7. FIG. 7 is a top-down view of a semiconductor structure with multiple transistor-equivalent structures having a shared drain according to one embodiment of the disclosure. A semiconductor structure 700 on a substrate 702 may include a shared drain 716 having a quadrilateral shape, such as a rectangle or square. Each edge of the quadrilateral may abut a region serving as a body of a transistor. For example, regions 752, 754, 756, and 758 may abut the shared drain 716. Regions 712, 714, 732, and 734 within regions 752, 754, 756, and 758, respectively, may be source regions for each of the four transistor structures. Gates 718, 720, 722, and 724 may be formed over the abutting portion of shared drain 716 with each of the regions 752, 754, 756, and 758, respectively. Manufacturing of the semiconductor structure 700 may include similar steps and processes as those described above with reference to FIG. 5 and FIGS. 6A-6F for manufacturing two transistors with a shared drain. Additionally, although the shared drain 716 is shown as a quadrilateral, the shared drain 716 may take other shaped and allow for more or less transistors to share the shared drain. For example, the shared drain 716 may be formed in a triangular shape for three transistors with a shared drain, or the shared drain 716 may be formed in a hexagonal shape for five transistors with a shared drain. Shared drains of different sizes may be formed on the same substrate to allow different transistor configurations within a single electronic device.

Figure 8:
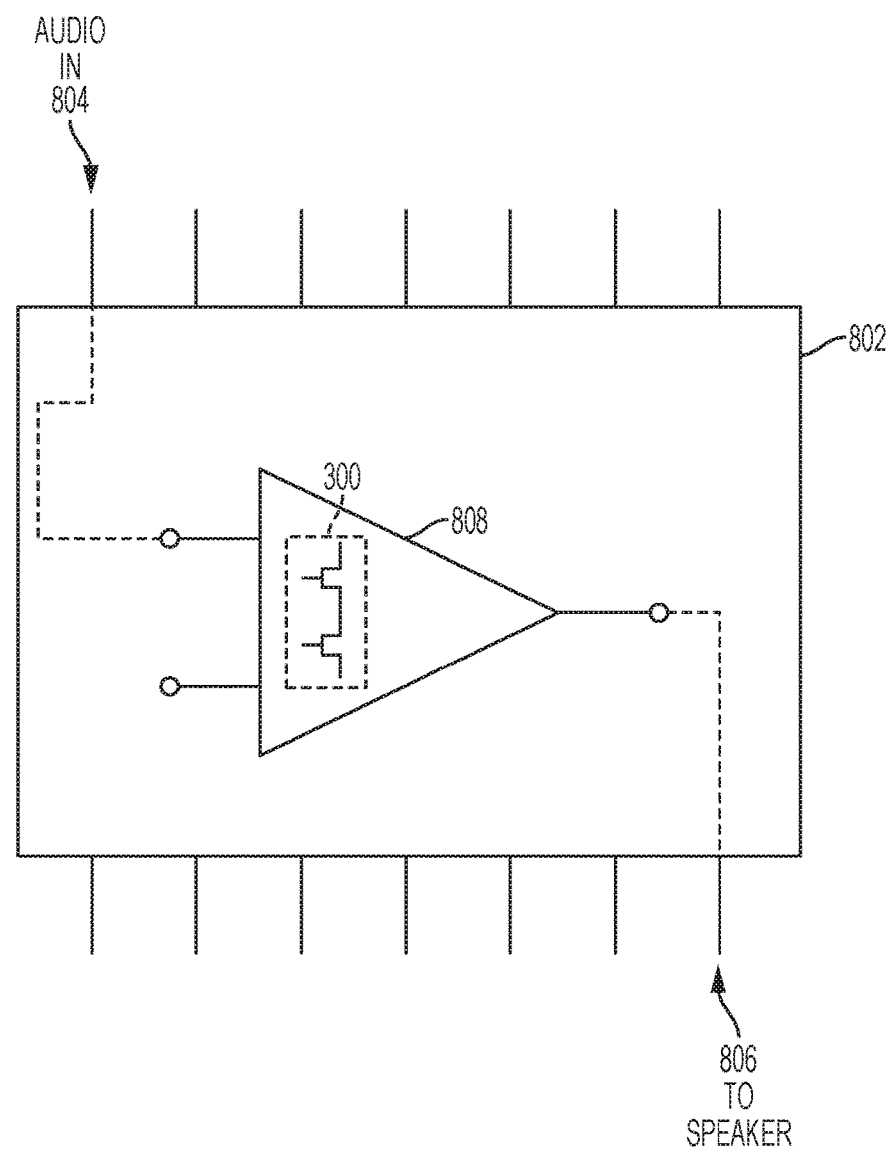
FIG. 8 is a circuit schematic illustrating use of a semiconductor structure with a shared drain according to one embodiment of the disclosure.

One example use of a semiconductor structure such as those described above was described above with reference to FIG. 3. Such a circuit can be included in an electronic product when integrated in an amplifier or in an integrated circuit (IC). FIG. 8 is a circuit schematic illustrating use of a semiconductor structure with a shared drain according to one embodiment of the disclosure. An integrated circuit (IC) 802 packaged as a chip may include amplifier 808 formed from transistors with a shared drain in the semiconductor structure 300. One application for the amplifier is to amplify audio signals. The IC 802 may include one or more input pins 804 for receiving audio data, which may be digital or analog. The audio data may be delivered to the amplifier 808 after other processing within the IC 802. The amplifier 808 may produce an output signal delivered to one or more output pins 806, and that output signal may be used to drive a speaker or other transducer (not shown).

The schematic flow chart diagram of FIG. 5 is generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A semiconductor structure, comprising:
    a first source and a second source;
    a first body and a second body;
    a first gate and a second gate; and
    a drain, located between the first body and the second body, shared by the first source, the second source, the first body, the second body, the first gate, and the second gate,
    wherein the drain is coupled to a buried layer such that the first source and the first body are isolated from the second source and the second body,
    wherein the first source, the first body, the second source, and the second body are isolated by the buried layer from a substrate;
    wherein the first source, the first body, the first gate, and the shared drain operate as a first transistor, and wherein the second source, the second body, the second gate, and the shared drain operate as a second transistor, and
    wherein the first transistor is configured to operate at a first voltage requirement and the second transistor is configured to operate at a second voltage requirement, different from the first voltage requirement.

2. The semiconductor structure of claim 1, wherein the shared drain is configured to float during operation of the first transistor and the second transistor.

3. The semiconductor structure of claim 1, wherein a first overlap distance between the shared drain and the first gate is different than a second overlap distance between the shared drain and the second gate.

4. The semiconductor structure of claim 1, wherein a first distance between the shared drain and the first source is different than a second distance between the shared drain and the second source.

5. The semiconductor structure of claim 1, wherein the shared drain provides an equivalent function of a first drain of a first transistor coupled to a second drain of a second transistor.

6. The semiconductor structure of claim 1, further comprising:
    a third source;
    a third body; and
    a third gate, wherein the drain is also shared by the third source and the third gate.

7. An apparatus, comprising:
    a controller integrated circuit (IC) comprising:
        a first audio input configured to receive an audio signal; and
        an amplifier coupled to the first audio input and comprising one or more field effect transistors (FETs), wherein at least one of the one or more FETs comprises:
            a first source and a second source;
            a first body and a second body;
            a first gate and a second gate; and
            a drain, located between the first body and the second body, shared by the first source, the first body, the second source, the second body, the first gate, and the second gate,
            wherein the drain is coupled to a buried layer such that the first source and the first body and the second source and the second body are isolated from each other,
            wherein the first source, the first body, the second source, and the second body are isolated by the buried layer from a substrate;
            wherein the first source, the first body, the first gate, and the shared drain operate as a first transistor, and wherein the second source, the second body, the second gate, and the shared drain operate as a second transistor, and
            wherein the first transistor is configured to operate at a first voltage requirement and the second transistor is configured to operate at a second voltage requirement, different from the first voltage requirement.

8. The apparatus of claim 7, wherein the shared drain is configured to float during operation of the first transistor and the second transistor.

9. The apparatus of claim 7, wherein a first overlap distance between the shared drain and the first gate is different than a second overlap distance between the shared drain and the second gate.

10. The apparatus of claim 7, wherein a first distance between the shared drain and the first source is different than a second distance between the shared drain and the second source.

11. The apparatus of claim 7, wherein the shared drain provides an equivalent function of a first drain of a first transistor coupled to a second drain of a second transistor.

* * * * *